United States Patent
Wu et al.

(10) Patent No.: US 8,147,909 B2
(45) Date of Patent: Apr. 3, 2012

(54) METHOD OF MAKING AND USING ALLOY SUSCEPTOR WITH IMPROVED PROPERTIES FOR FILM DEPOSITION

(75) Inventors: Shuo-Jieh Wu, Nantou (TW); Hsu Chun Yuan, Hsinchu (TW); Tung-Li Lee, Jhubei (TW); Steven Li, Shih-chu (TW); Hs Chiu, Zhudong Town (TW); Yen-Yu Chen, Taichung (TW); Alan Chen, Kaohsiung (TW); Ming Jie He, Jhubei (TW); Yu-Wei Hsueh, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 392 days.

(21) Appl. No.: 12/412,186

(22) Filed: Mar. 26, 2009

(65) Prior Publication Data

US 2010/0247773 A1    Sep. 30, 2010

(51) Int. Cl.
    *C23C 16/00* (2006.01)
(52) U.S. Cl. ......... 427/255.15; 427/255.11; 427/255.19; 427/255.32; 427/255.7
(58) Field of Classification Search ............. 427/255.11, 427/15, 19, 32, 70
    See application file for complete search history.

(56) References Cited

U.S. PATENT DOCUMENTS

| 5,834,059 A * | 11/1998 | Anderson et al. ........ 427/255.17 |
| 6,117,244 A | 9/2000 | Bang et al. |
| 7,288,020 B1 * | 10/2007 | Kiku .............................. 451/38 |
| 2004/0206804 A1 | 10/2004 | Kim et al. |
| 2005/0034675 A1 * | 2/2005 | Nakabayashi et al. ........ 118/728 |

* cited by examiner

*Primary Examiner* — Frederick Parker
(74) *Attorney, Agent, or Firm* — Haynes and Boone, LLP

(57) ABSTRACT

Provided is a method for processing a wafer that includes providing an alloy susceptor including an exterior surface and a wafer contact surface. The exterior surface of the alloy susceptor is treated to produce a roughness of the exterior surface. The roughened exterior surface of is coated with a ceramic material. The alloy susceptor including the ceramic-coated roughened exterior surface is positioned in a wafer process chamber. A plurality of layers of a film are deposited on the ceramic-coated roughened exterior surface of the alloy susceptor, wherein a first adhesion exists between the plurality of layers of the film and the ceramic material coated on the roughened exterior surface of the alloy susceptor that is greater than a second adhesion that would exist between the plurality of layers of the film and a non-roughened exterior surface of the alloy susceptor without the ceramic material.

11 Claims, 6 Drawing Sheets

METHOD OF MAKING AND USING ALLOY SUSCEPTOR WITH IMPROVED PROPERTIES FOR FILM DEPOSITION

BACKGROUND

In some semiconductor manufacturing processes, susceptors having a polished alloy surface are used. For example, in some film deposition processes, one or more wafers may be positioned on a polished alloy susceptor that is located in a wafer process chamber. The polished alloy susceptor may then be heated to a deposition temperature and the wafer process chamber may be set to a deposition pressure. A source gas and a reaction gas may then be introduced into the wafer process chamber such that they react and deposit a thin film on the wafer(s) and the polished alloy susceptor. As this process is carried out a plurality of times, the film deposited on the polished alloy susceptor may begin to peel away or otherwise detach from the polished alloy susceptor, which can contaminate the wafer process chamber and cause problems in the processing of the wafer.

SUMMARY

A wafer processing system is provided that includes a wafer process chamber. An alloy susceptor is located in the wafer process chamber. The alloy susceptor includes an exterior portion and a wafer contact portion. The exterior portion has a rough surface that is coated with a ceramic material. At least one system is coupled to the wafer process chamber and operable to introduce at least one film component into the wafer process chamber.

A method for processing a wafer is provided that includes providing an alloy susceptor including an exterior surface and a wafer contact surface. The method further includes treating the exterior surface to produce a roughness of the exterior surface, wherein the wafer contact surface is not treated. The method further includes coating the roughened exterior surface with a ceramic material, wherein the wafer contact surface is not coated. The method further includes positioning the alloy susceptor including the ceramic-coated roughened exterior surface in a wafer process chamber. The method further includes depositing a plurality of layers of a film on the ceramic-coated roughened exterior surface of the alloy susceptor, wherein a first adhesion exists between the plurality of layers of the film and the ceramic material coated on the roughened exterior surface of the alloy susceptor that is greater than a second adhesion that would exist between the plurality of layers of the film and a non-roughened exterior surface of the alloy susceptor without the ceramic material.

Another method for processing a wafer is provided that includes positioning a first wafer on a wafer contact surface of an alloy susceptor that is located in a wafer process chamber, wherein an exterior surface of the alloy susceptor that excludes the wafer contact surface has been treated to produce a roughness of the exterior surface, and that roughened exterior surface has then been coated with a material. The method further includes depositing a first film layer on the first wafer and the coated roughened exterior surface of the alloy susceptor. The method further includes positioning a second wafer on the wafer contact surface. The method further includes depositing a second film layer on the second wafer and the coated roughened exterior surface of the alloy susceptor that includes the first film layer, wherein a first adhesion exists between the first and second film layers and the material coated on the roughened exterior surface of the alloy susceptor that is greater than a second adhesion that would exist between the first and second film layers and a non-roughened exterior surface of the alloy susceptor without the material.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1b is a bottom perspective view illustrating an embodiment of the alloy susceptor of FIG. 1a;

DETAILED DESCRIPTION

Figure 1A:
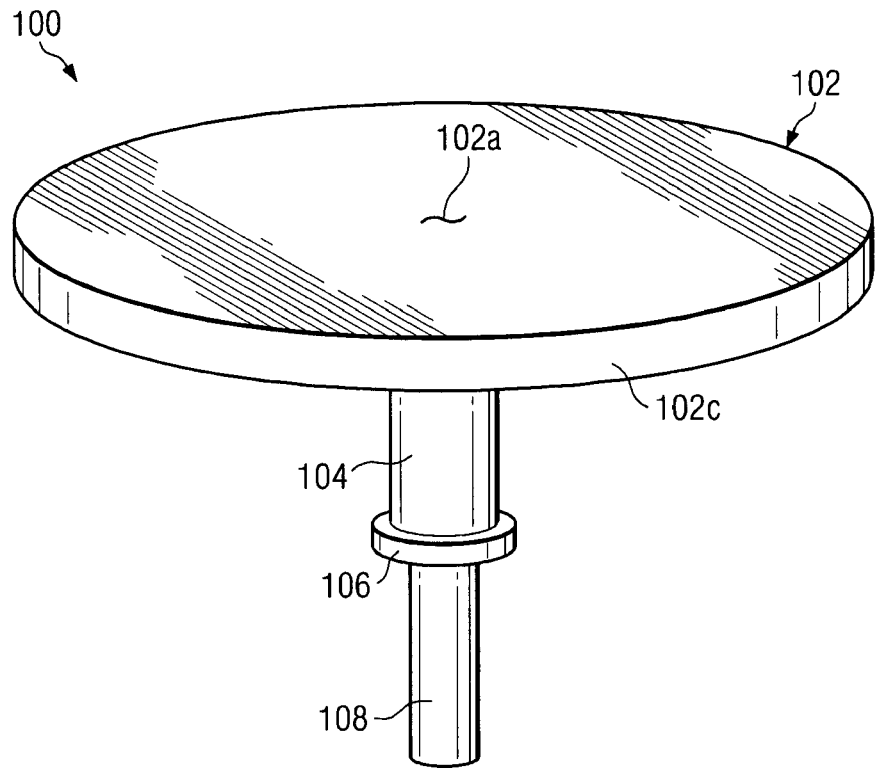
FIG. 1a is a top perspective view illustrating an embodiment of an alloy susceptor.

The present disclosure relates generally to semiconductor manufacturing processes and in particular to an alloy susceptor with improved properties for film deposition in the semiconductor manufacturing process.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1B:
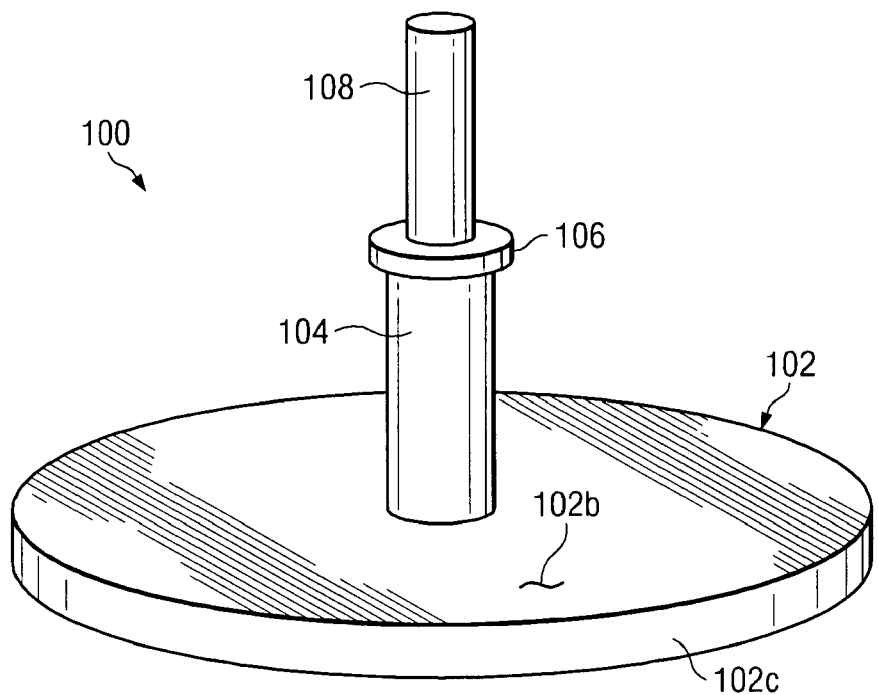

Referring now to FIGS. 1a and 1b, an alloy susceptor 100 is illustrated. The alloy susceptor 100 includes a circular base 102 having a top wafer contact surface 102a, a bottom surface 102b located opposite the base 102 from the top wafer contact surface 102a, and a side surface 102c that extends between the top wafer contact surface 102a and the bottom surface 102b. An alloy susceptor support 104 extends from a central location on the bottom surface 102b of the base 102. A flange 106 is located on an end of the alloy susceptor support 104 that is opposite the end of the alloy susceptor support 104 that is located immediately adjacent the bottom surface 102b of the base 102. A conduit 108 extends from the flange 106 and may house, for example, wiring and/or other transmission lines (not illustrated.). The base 102, support 104, flange 106, conduit 108, and/or other components of the alloy susceptor 100 are fabricated from a metal alloy such as, for example, a nickel alloy, a chromium alloy, an aluminum alloy, stainless steel, and/or a variety of other metal alloys known in the art, and the wafer contact surface 102a, the bottom surface 102b, the side surface 102c, and the surfaces of the support 104, flange 106, conduit 108 may be polished. While the alloy susceptor 100 illustrated in FIGS. 1a and 1b includes a specific structure and components, one of skill in the art will recognize that the components and/or the structure described above may be modified, removed, and/or replaced without departing from the scope of the present disclosure.

Figure 2:
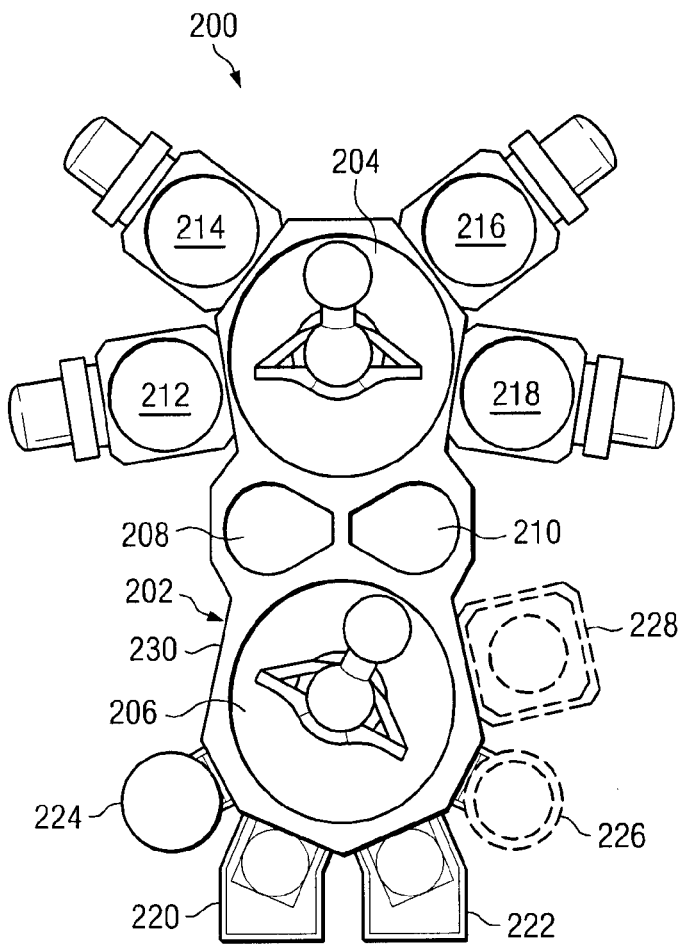
FIG. 2. is a top view illustrating an embodiment of a multi-chamber process tool.

Referring now to FIG. 2, a multi-chamber process tool 200 is illustrated. In an embodiment, the multi-chamber process tool 200 allows a number of sequential process steps to be carried out on a wafer without exposing the wafer to the atmosphere. The multi-chamber process tool 200 includes a base 202 having a high-vacuum transfer chamber 204, a buffer-transfer chamber 206, a pre-clean chamber 208, and a cool-down chamber 210. A plurality of wafer process chambers 212, 214, 216, and 218 are coupled to the base 202 and located adjacent the transfer chamber 204. In an embodiment, the wafer process chambers 212, 214, 216, and 218 are chambers including wafer processing devices for processing a wafer using techniques such as, for example, chemical vapor deposition and/or a variety of other processing techniques known in the art. A plurality of cassette loadlocks 220 and 222 are coupled to the base 202 adjacent each other and the buffer chamber 206. A de-gas/wafer orienting chamber 224 is coupled to the base 202 adjacent the cassette loadlock 220 and the buffer chamber 206. A cool-down chamber 226 is coupled to the base 202 adjacent the cassette loadlock 222 and the buffer chamber 206. A metal anneal chamber 228 is coupled to the base 202 adjacent the cool-down chamber 226 and the buffer chamber 206. An expansion slot 230 is located on the base 202 and operable to couple a chamber (not illustrated) or other processing device to the base 202. One of skill in the art will recognize that a variety of different processing devices may be added to the base and/or replace the processing devices illustrated in FIG. 2.

In operation, the buffer-transfer chamber 206 may receive wafers from the cassette loadlock 220, and then sequentially feed the wafers to the de-gas/wafer orienting chamber 224 and the pre-clean chamber 208. The high-vacuum transfer chamber 204 then may receive the wafers from the pre-clean chamber 208 and transfer the wafers to the wafer process chambers 212, 214, 216, and/or 218, as needed, and then deliver the wafers to the cool-down chamber 210. The buffer-transfer chamber 206 then may transfer the wafers from the cool-down chamber 210 to the cassette loadlock 222. In an embodiment, the buffer transfer chamber 206 may sequentially feed the wafers to the metal anneal chamber 228 and cool-down chamber 226, respectively, before delivering the wafers to the loadlock 222.

Referring now to FIGS. 1a, 1b, 3a, 3b, 3c, 3d, and 3e, a method 300 for processing a wafer is illustrated. The method 300 begins at block 302 where an alloy susceptor is provided.

Figure 3A:
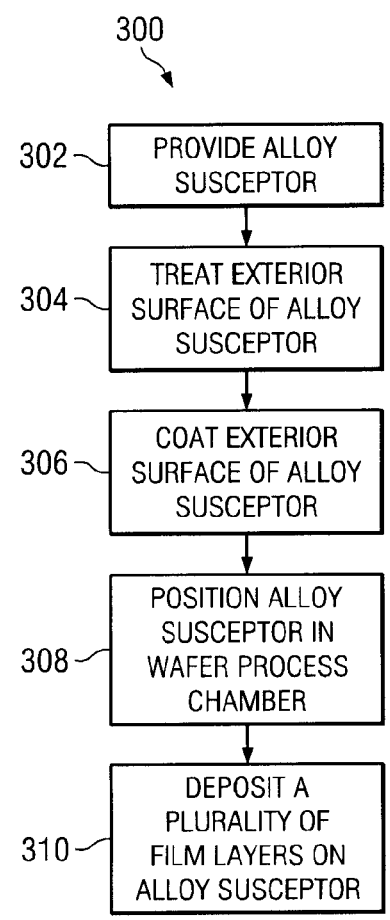
FIG. 3a is a flow chart illustrating an embodiment of a method for processing a wafer.
Figure 3B:
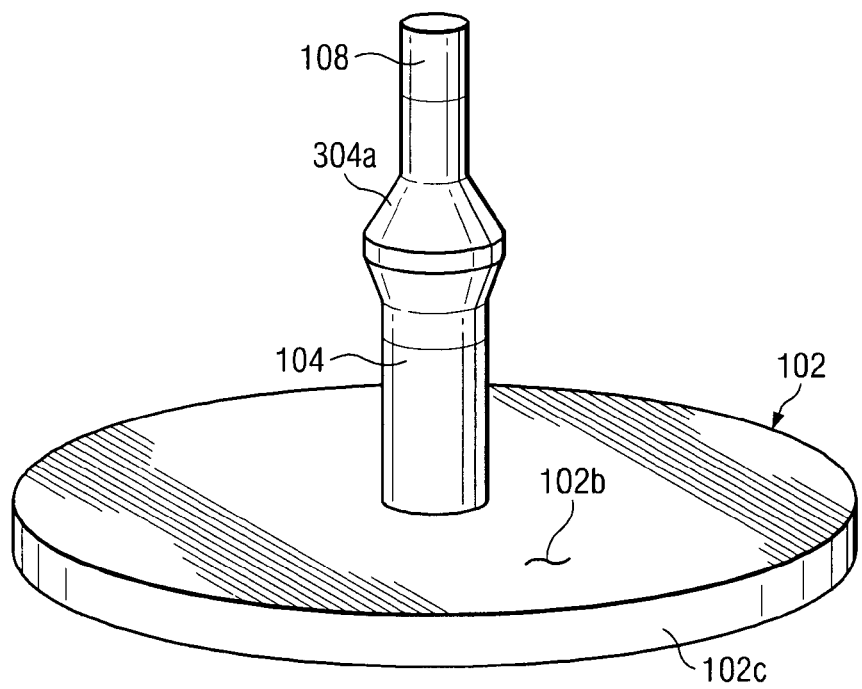
FIG. 3b is a bottom perspective view illustrating an embodiment of the alloy susceptor of FIGS. 1a and 1b including a protective material.
Figure 3C:
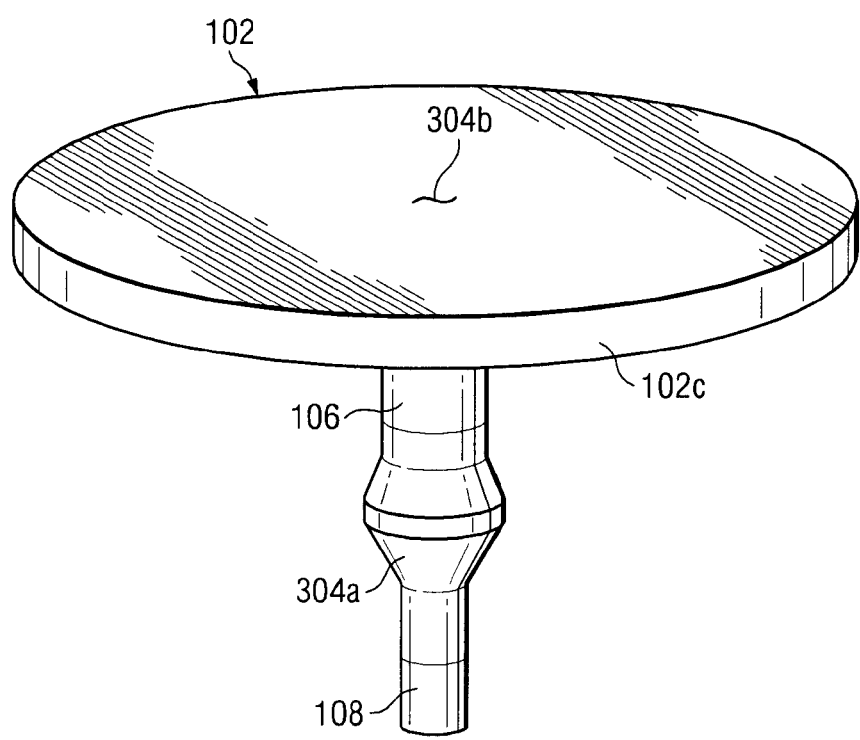
FIG. 3c is a top perspective view illustrating an embodiment of the alloy susceptor of FIGS. 1a and 1b including a protective material.

In an embodiment, the alloy susceptor 100, described above with reference to FIGS. 1a and 1b, is provided. The method 300 then proceeds to block 304 where the an exterior surface of the alloy susceptor is treated. In the illustrated embodiment described below, the exterior surface of the alloy susceptor 100 excludes the wafer contact surface 102a and includes the bottom surface 102b, the side surface 102c, and a portion of the surface of the alloy susceptor support 104. However, in another embodiment, the exterior surface of an alloy susceptor may include any surface on the alloy susceptor 100 that is not a wafer contact surface and that may be exposed to the deposition of films within a wafer process chamber, as will be described in further detail below. At block 304 of the method 300, the alloy susceptor 100 may be prepared for exterior surface treatment by covering a portion of the alloy susceptor support 104, the flange 106, and the conduit 108 with a protective material 304a, as illustrated in FIG. 3b, and covering the wafer contact surface 102a with a protective material 304b, as illustrated in FIG. 3c, such that only the exterior surface of the alloy susceptor 100 is exposed.

Figure 3D:
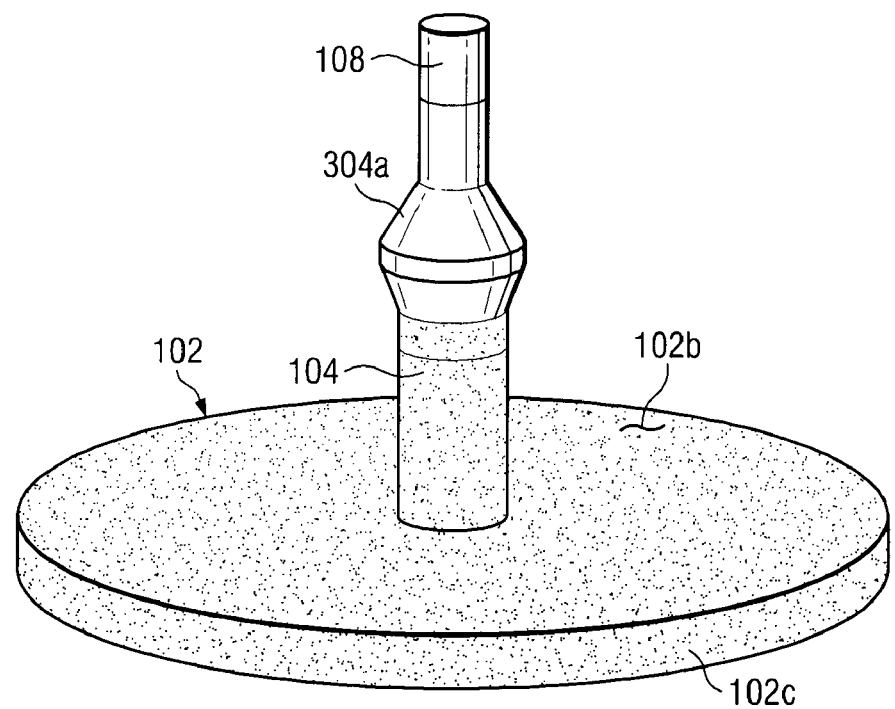
FIG. 3d is a bottom perspective view illustrating an embodiment of the alloy susceptor of FIGS. 3b and 3c after a surface roughening treatment.
Figure 3E:
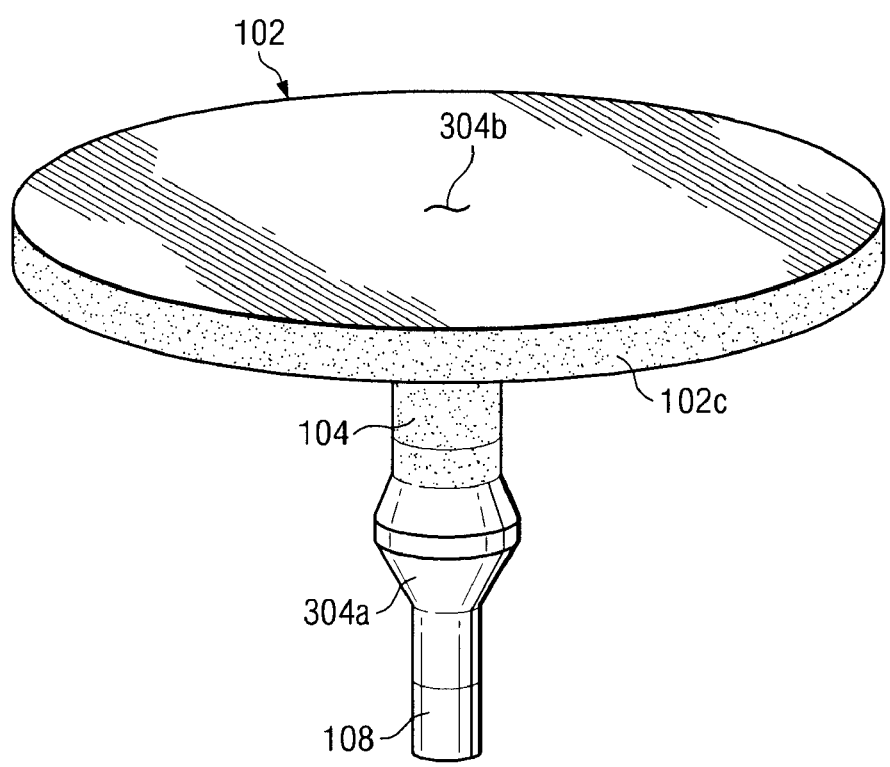
FIG. 3e is a top perspective view illustrating an embodiment of the alloy susceptor of FIGS. 3b and 3c after a surface roughening treatment.

In an embodiment, the protective material 304b may not be needed on the wafer contact surface 102a, as the alloy susceptor 100 may be positioned during the exterior surface treatment (and later coating, described below) in a manner that protects the wafer contact surface 102a. A treatment is then applied to the alloy susceptor 100 to produce a roughness on the exterior surface. In an embodiment, the treatment is a sand-blasting treatment. In an embodiment, the treatment includes directing an aluminum material that is under pressure at the exterior surface of the alloy susceptor 100. Due to the protective material 304a and/or 304b, the roughness will only be produced on the exterior surface of the alloy susceptor 100, as the protective material 304a will protect a portion of the surface of the alloy susceptor support 104, the surface of the flange 106, and the surface of the conduit 108 from the roughening members (e.g., the aluminum material directed at the alloy susceptor 100 under pressure) used in the treatment, while the protective material 304b will protect the wafer contact surface 102a from the roughening members used in the treatment, as illustrated in FIGS. 3d and 3e. In an embodiment, the roughness produced on the exterior surface of the alloy susceptor 100 includes a range of 45 to 60 μm.

Figure 3F:
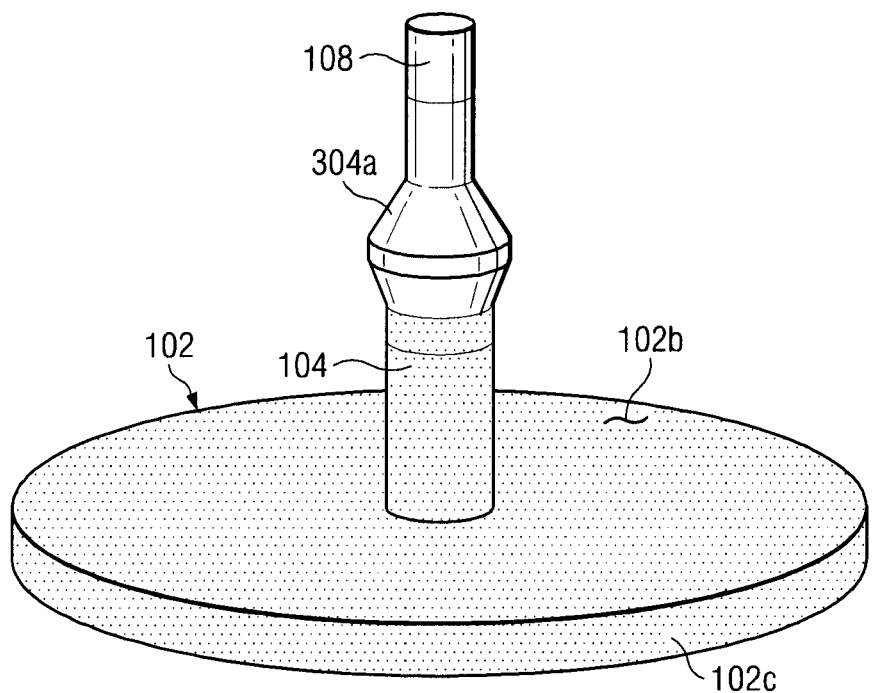
FIG. 3f is a bottom perspective view illustrating an embodiment of the alloy susceptor of FIGS. 3d and 3e after a surface coating.
Figure 3G:
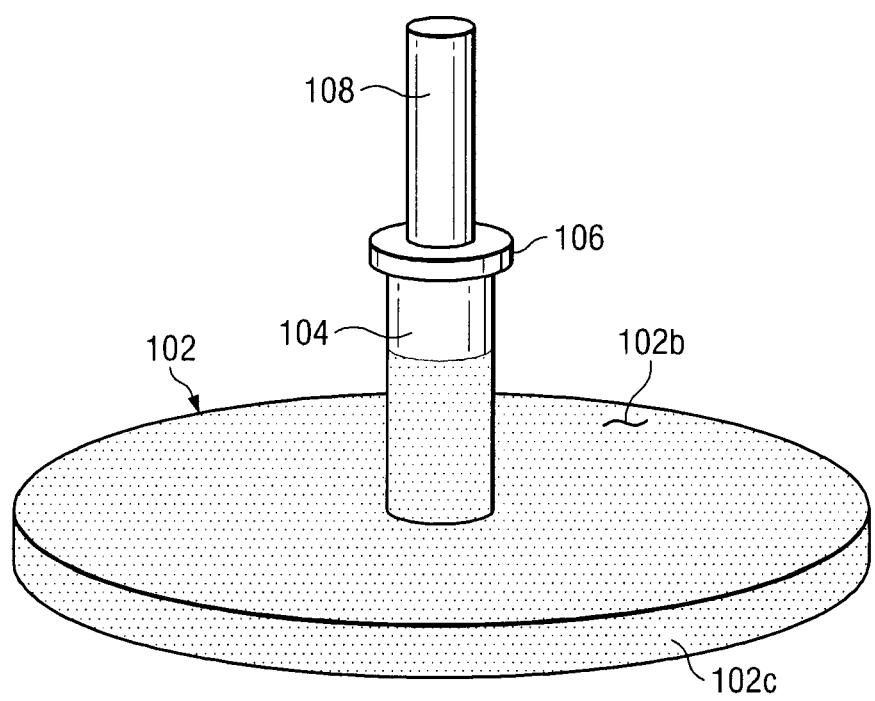
FIG. 3g is a bottom perspective view illustrating an embodiment of the alloy susceptor of FIG. 3f after a surface coating and with a protective material removed.
Figure 3H:
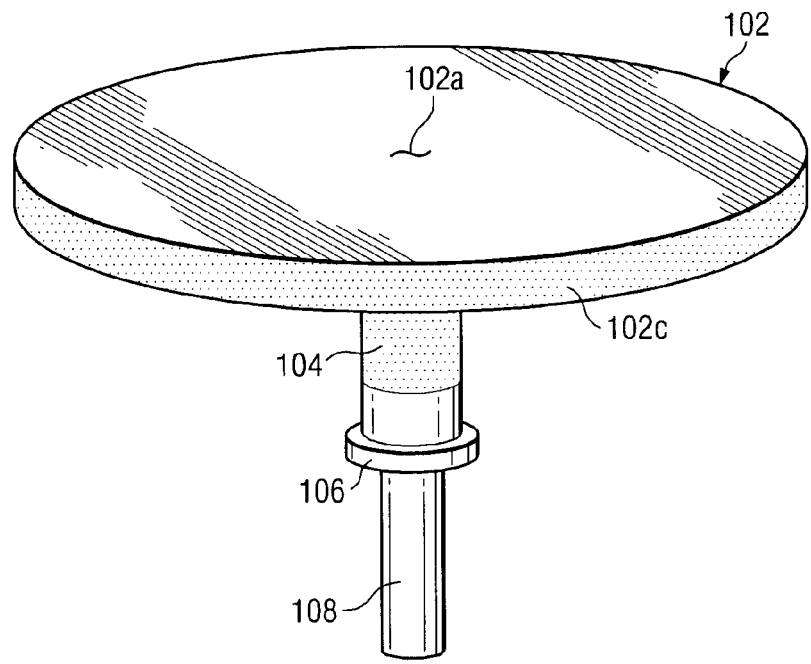
FIG. 3h is a top perspective view illustrating an embodiment of the alloy susceptor of FIG. 3f after a surface coating and with a protective material removed.

Referring now to FIGS. 1a, 1b, 3a, 3f, 3g, and 3h, the method 300 then proceeds to block 306 where the exterior surface of the alloy susceptor is coated. A coating is applied to the roughened exterior surface of the alloy susceptor 100, as illustrated in FIG. 3f. In an embodiment, the coating includes a ceramic material. In an embodiment, the ceramic material coating includes aluminum oxide ($Al_2O_3$). In an embodiment, the coating applied to the roughened exterior surface of the alloy susceptor 100 is applied such that it produces a coating layer on the exterior surface that is approximately 50 μm in thickness. In an embodiment, the coating is applied as a spray from a nozzle of a coating device (not illustrated), and the coating material (e.g., aluminum oxide) leaves the nozzle of the coating device at a temperature of approximately 10,000 degree Celcius and arrives on the exterior surface of the alloy susceptor 100 at a temperature of approximately 2000 degrees C. Due to the protective material 304a and/or 304b, the coating will only be applied to the exterior surface of the alloy susceptor 100, as when the protective material 304a is removed, the coating will not be located on a portion of the surface of the alloy susceptor support 104, the surface of the flange 106, and the surface of the conduit 108, as illustrated in FIG. 3g, while with the protective material 304b removed, the coating will not be located on the wafer contact surface 102a, as illustrated in FIG. 3h.

Figure 4:
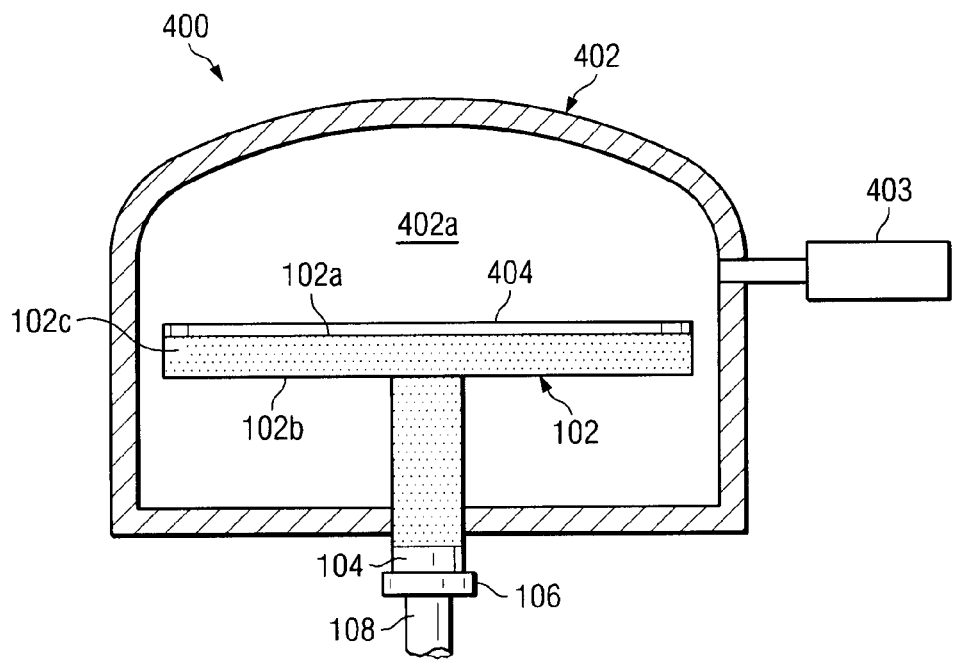
FIG. 4 is a cross sectional view illustrating an embodiment of the alloy susceptor of FIGS. 3g and 3h positioned in a wafer process chamber of the multi-chamber process tool of FIG. 2.

Referring now to FIGS. 2, 3a, 3g, 3h, and 4, the method 300 then proceeds to block 308 where the alloy susceptor is positioned in a wafer process chamber. In an embodiment, a wafer process chamber 400, which may be one or more of the wafer process chambers 212, 214, 216, and 218, described above with reference to FIG. 2, is provided. The wafer process chamber 400 includes a base 402 that defines a cavity 402a. A film deposition system 403 is coupled to the wafer process chamber 400 and operable to introduce a plurality of film components into the cavity 402a of wafer process chamber 400. The alloy susceptor 100 may be positioned in the cavity 402a of the water process chamber 300 such that the water contact surface 102a and the exterior surface (which has been roughened and coated, described above, and, in the illustrated embodiment, includes the bottom surface 102b and side surface 102c of the base 102 along with a portion of the surface of the alloy susceptor support 104) are located in the cavity 402a. The method 300 then proceeds to block 310 where a plurality of films layers are deposited on the alloy susceptor. In an embodiment, a wafer 404 may be positioned on the wafer contact surface 102a of the alloy susceptor 100, as illustrated in FIG. 4.

The film deposition system 403 then introduces a plurality of film components into the cavity 402a of the wafer process chamber 400 and, in response, the plurality of film components combine to form a film that is deposited on the wafer 404 and the exterior surface of the alloy susceptor 100 that has been roughened and coated, as described above, and includes the bottom surface 102b and side surface 102c of the base 102 along with a portion of the surface of the alloy susceptor support 104. In an embodiment, the plurality of film components combine to form a film having a higher dielectric constant than silicon dioxide (i.e., a "high-K film"). In an embodiment, the plurality of film components combine to form a zirconium oxide ($ZrO_2$) film. In experimental embodiments, it was found that an adhesion exists between a zirconium oxide film and an aluminum oxide ceramic material coated on the roughened exterior surface of the alloy susceptor 100 that is greater than an adhesion that would exist between that film and a non-roughened exterior surface of the alloy susceptor 100 without the ceramic material (e.g., the alloy susceptor of FIGS. 1a and 1b before the exterior surface has been roughened and had the coating applied.) This increased adhesion prevents the deposited film from peeling from the alloy susceptor 100, as occurs with the alloy susceptor when the exterior surface has not been roughened and coated as described above.

The wafer 404 may then be removed from the wafer contact surface 102a on the alloy susceptor 100 in the wafer process chamber 400, and another wafer may be positioned on the wafer contact surface 102a such that the film deposition process, described above, may be repeated and result in a plurality of film layers being deposited on the exterior surface of the alloy susceptor 100. In experimental embodiments, it was found that an adhesion exists between a plurality of zirconium oxide film layers and an aluminum oxide ceramic material coated on the roughened exterior surface of the alloy susceptor 100 that is greater than an adhesion that would exist between those film layers and a non-roughened exterior surface of the alloy susceptor 100 without the ceramic material (e.g., the alloy susceptor of FIGS. 1a and 1b before the exterior surface has been roughened and had the coating applied.) Thus, a wafer processing system is provided that allows a film layer or a plurality of film layers to be deposited on an exterior surface of an alloy susceptor in a wafer process chamber while preventing a peeling of the film layer(s) from the alloy susceptor that might contaminate the wafer process chamber 400. While the embodiment described above is directed to a susceptor used to heat wafers in a vacuum chamber, embodiments that include cooling or etching components in the vacuum chamber are contemplated that fall within the scope of the present disclosure.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for processing a wafer, comprising:
providing an alloy susceptor comprising an exterior surface and a wafer contact surface;
treating the exterior surface to produce a roughness of the exterior surface, wherein the wafer contact surface is not treated;
coating the roughened exterior surface with a ceramic material, wherein the wafer contact surface is not coated;
positioning the alloy susceptor comprising the ceramic-coated roughened exterior surface in a wafer process chamber; and
depositing a plurality of layers of film, each of the plurality of layers of film being of a different material than the ceramic material, on the ceramic-coated roughened exterior surface of the alloy susceptor, wherein a first adhesion exists between the plurality of layers of film and the ceramic material coated on the roughened exterior surface of the alloy susceptor that is greater than a second adhesion that would exist between the plurality of layers of film and a non-roughened exterior surface of the alloy susceptor without the ceramic material.

2. The method of claim 1, wherein the roughness is produced on the exterior surface of the alloy susceptor by directing an aluminum material that is under pressure at the exterior surface.

3. The method of claim 1, wherein the roughness produced on the exterior surface of the alloy susceptor comprises a range of about 45 to about 60 μm.

4. The method of claim 1, wherein the ceramic material coated on the roughened exterior surface of the alloy susceptor comprises a thickness of about 50 μm.

5. A method for processing a wafer, comprising:
providing an alloy susceptor comprising an exterior surface and a wafer contact surface;
treating the exterior surface to produce a roughness of the exterior surface, wherein the wafer contact surface is not treated;
coating the roughened exterior surface with an aluminum oxide ceramic material, wherein the wafer contact surface is not coated;
positioning the alloy susceptor comprising the aluminum oxide ceramic-coated roughened exterior surface in a wafer process chamber; and
depositing a plurality of layers of film, each of the plurality of layers of film being of a different material than the aluminum oxide ceramic material, on the aluminum oxide ceramic-coated roughened exterior surface of the alloy susceptor, wherein a first adhesion exists between the plurality of layers of film and the aluminum oxide ceramic material coated on the roughened exterior surface of the alloy susceptor that is greater than a second adhesion that would exist between the plurality of layers of film and a non-roughened exterior surface of the alloy susceptor without the aluminum oxide ceramic material.

6. The method of claim 5, wherein the aluminum oxide is applied to the roughened exterior surface of the alloy susceptor at a temperature of at least 2000 degrees Celsius.

7. A method for processing a wafer, comprising:
positioning a first wafer on a wafer contact surface of an alloy susceptor that is located in a wafer process chamber, wherein an exterior surface of the alloy susceptor that excludes the wafer contact surface has been treated to produce a roughness of the exterior surface, and that roughened exterior surface has been coated with a ceramic material;
depositing a first film layer on the first wafer and the ceramic coated roughened exterior surface of the alloy susceptor, wherein the first film layer is of a different material than the ceramic material;
positioning a second wafer on the wafer contact surface; and
depositing a second film layer on the second wafer and the ceramic coated roughened exterior surface of the alloy susceptor that includes the first film layer, wherein the second film layer is of a different material than the ceramic material;
wherein a first adhesion exists between the first and second film layers and the ceramic material coated on the roughened exterior surface of the alloy susceptor that is greater than a second adhesion that would exist between the first and second film layers and a non-roughened exterior surface of the alloy susceptor without the ceramic material.

8. The method of claim 7, wherein the roughness produced on the exterior surface of the alloy susceptor comprises a range of about 45 to about 60 µm.

9. The method of claim 7, wherein the ceramic material coated on the roughened exterior surface of the alloy susceptor comprises an aluminum oxide ceramic material.

10. The method of claim 8, wherein the ceramic material coated on the roughened exterior surface of the alloy susceptor comprises a thickness of about 50 µm.

11. The method of claim 7, wherein the roughness is produced on the exterior surface of the alloy susceptor by directing pressurized particles at the exterior surface.

* * * * *

UNITED STATES PATENT AND TRADEMARK OFFICE
CERTIFICATE OF CORRECTION

PATENT NO. : 8,147,909 B2  
APPLICATION NO. : 12/412186  
DATED : April 3, 2012  
INVENTOR(S) : Shuo-Jieh Wu et al.

Page 1 of 1

It is certified that error appears in the above-identified patent and that said Letters Patent is hereby corrected as shown below:

On the title page item;  
(75) Inventors: change "Steven Li" to "Steven Lin"

Signed and Sealed this  
Nineteenth Day of June, 2012

David J. Kappos  
*Director of the United States Patent and Trademark Office*